(12) United States Patent
Sankin et al.

(10) Patent No.: US 6,693,308 B2
(45) Date of Patent: Feb. 17, 2004

(54) POWER SIC DEVICES HAVING RAISED GUARD RINGS

(75) Inventors: Igor Sankin, Starkville, MS (US); Janna B. Dufrene, Starkville, MS (US)

(73) Assignee: Semisouth Laboratories, LLC, Starkville, MS (US)

( * ) Notice: Subject to any disclaimer, the term of this patent is extended or adjusted under 35 U.S.C. 154(b) by 0 days.

(21) Appl. No.: 10/079,892

(22) Filed: Feb. 22, 2002

(65) Prior Publication Data

US 2003/0162355 A1 Aug. 28, 2003

(51) Int. Cl.[7] ................. H01L 33/00; H01L 31/0312; H01L 29/24
(52) U.S. Cl. ................. 257/103; 257/77; 257/102
(58) Field of Search .................. 257/103, 77, 102, 257/613, 656, 657

(56) References Cited

U.S. PATENT DOCUMENTS

| | | | |
|---|---|---|---|
| 3,755,014 A | * | 8/1973 | Appels et al. ............... 257/519 |
| 4,982,260 A | | 1/1991 | Chang et al. |
| 5,243,204 A | * | 9/1993 | Suzuki et al. ................. 257/77 |
| 5,329,141 A | * | 7/1994 | Suzuki et al. ............... 257/103 |
| 5,712,502 A | | 1/1998 | Mitlehner et al. |
| 5,789,311 A | | 8/1998 | Ueno et al. |
| 5,967,795 A | | 10/1999 | Bakowsky et al. |

OTHER PUBLICATIONS

Baliga, *Power Semiconductor Devices*, Chapter 3, 66–125 (1996).
Li, et al., "Theoretical and Experimental Study of 4H–SiC Junction Edge Termination", Materials Science Forum, vols. 338–342, 1375–1378 (2000). (cited as ICSCRM '99, Part 2, 1375–1378 (2002) in specification at p. 3).
Spitz, et al., "2.6 kV 4H–SiC Lateral DMOSFET'S", IEEE Electron Device Letters., vol. 19, No. 4, 100–102 (1988).
Ludikhuize, "A Review of RESURF Technology", ISPSD (2000).

* cited by examiner

*Primary Examiner*—John F. Niebling
*Assistant Examiner*—Walter Lindsay, Jr.
(74) *Attorney, Agent, or Firm*—Piper Rudnick LLP; Steven B. Kelber

(57) ABSTRACT

Silicon carbide semiconductor power devices having epitaxially grown guard rings edge termination structure are provided. Forming the claimed guard rings from an epitaxially grown SiC layer avoids the traditional problems associated with implantation of guard rings, and permits the use of self aligning manufacturing techniques for making the silicon carbide semiconductor power devices.

26 Claims, 6 Drawing Sheets

POWER SIC DEVICES HAVING RAISED GUARD RINGS

BACKGROUND OF THE INVENTION

1. Field of the Invention

The present invention relates generally to epitaxially grown guard ring edge termination structures for vertical and lateral SiC power semiconductor devices, SiC power devices having such guard rings, and methods of preparing these devices.

2. Background of the Technology

One distinguishing feature of semiconductor power devices is their high voltage blocking capability. The ability to support high voltages is largely determined by the onset of the phenomenon known as avalanche breakdown, which occurs when the electric field within the device structure becomes very large and the rate of impact ionization through the depletion region approaches infinity. The large electric fields in semiconductor devices that may trigger avalanche breakdown can occur both within the interior regions of the device, where current transport takes place, and at the edges of such devices. Proper design of semiconductor power devices requires careful attention to field distributions at the interior and at the edges to ensure high voltage blocking capability. B. Jayant Baliga, *Power Semiconductor Devices*, Chapter 3, pp. 66–125 (1996).

Silicon carbide (SiC) semiconductor devices are known to possess superior voltage blocking capability as compared with silicon (Si) semiconductor devices, and it is desired for power SiC semiconductor devices to have a breakdown voltage that is as high as possible. See, e.g., Bakowsky, et al., U.S. Pat. No. 5,967,795. Avalanche breakdown for SiC devices may occur when the maximum electric field within the device exceeds the critical electric field for SiC, which is believed to be from 2 to 4 MV/cm. The maximum electric field of such devices usually occurs wherever the depletion region has the smallest width, typically at the surface or edges of the device, and terminates in the vicinity of the junction, or interface between two semiconductor layers. In the context of this application, the term junction also refers to the interface between a semiconductor and a metal layer. The depletion region is the region across the junction where the mobile carrier densities approach zero, and the size and shape of the depletion region varies as a function of semiconductor design, including the nature of the junction between the different layers of such a device. The occurrence of high electric fields at the edges of these devices may significantly reduce the breakdown voltage of such devices. B. Jayant Baliga, Power Semiconductor Devices. One way to solve this problem is to use mesa etching, which simply removes semiconductor material from the region of highest electric field. This approach, however, requires advanced passivation steps to reduce surface leakage current. Another way to solve the problem is to extend the depletion region from the edge of the device. The typical methods used are:

- extension of the electrode metal of a semiconductor device over the field oxide layer (so called field plates);
- formation of a sequence of conductive regions with floating potential surrounding the device, typically, heavily doped diffused or implanted rings with conductivity type opposite to that of the device bulk (so called guard rings);
- generation of a single wide diffused or implanted ring surrounding the device, with conductivity type opposite to that of the device bulk, which becomes fully depleted, and so that reduces potential gradient at the device edge (so called junction termination extension, or JTE).

Use of field plates is limited by relatively low voltages because of the finite dielectric strength of the field oxide between the plates and the device bulk. Because of the slow diffusion rates in SiC, JTE regions or guard rings are usually implanted, or introduced. For example, the use of junction termination extension structures has been suggested for different types of devices by Bakowsky, et al., U.S. Pat. No. 5,967,795; Mitlehner, et al., U.S. Pat. No. 5,712,502; Ueno, et al., U.S. Pat. No. 5,789,311; and Xueqing, et al., "Theoretical and Experimental Study of 4H—SiC Junction Edge Termination", Materials Science Forum, Volumes 338–342, 1375–1378 (2000).

In addition, the use of guard rings, fabricated by combination of ion implantation and etching steps is disclosed by, e.g., Chang, et al., U.S. Pat. No. 4,982,260. An implementation of implanted p-type guard ring in a lateral MOSFET was also disclosed in Spitz, et al., IEEE Electron Devices Ltrs., Vol. 19No. 4, (1988). Unlike the implanted guard rings in the cases mentioned above, epitaxially grown guard rings (EGR) are not believed to affect electron flow in the drift region, and are further believed to improve the traditional RESURF technology disclosed in Ludikhuize, "A Review of RESURF Technology", ISPSD (2000).

However, ion implantation is a costly fabrication step which requires a high temperature post implant annealing, and it may also lead to surface and bulk damage, which may result in a significant increase in leakage current. Therefore, there still exists a need for a better method for forming guard ring edge termination structures on SiC power semiconductor devices.

SUMMARY OF THE INVENTION

In accordance with one aspect of the present invention, diodes and transistors in SiC which implement edge termination structure by guard rings formed from a p-type epitaxial SiC layer, grown on top of an n-type SiC drift region are provided. In such known devices as bipolar junction transistors (BJTs), static induction transistors (SITs), and PiN diodes, this novel edge termination structure may be self-aligned, because it may be done at the same etching step with formation of another part of the device, for example PiN diode anode region, BJT overgrown base region, or SIT overgrown gate region.

A second aspect of the present invention provides a Schottky barrier diode in SiC having guard rings formed from a doped p-type epitaxial layer, grown on top of an n-type drift region. Further, in accordance with a third aspect of the present invention, lateral SiC semiconductor devices, such as LMOSFETs and lateral diodes having guard rings formed from a doped p-type epitaxial layer, grown on top of a lightly doped n-type drift region are provided.

The present invention is further directed to methods of preparing these semiconductor devices having the disclosed novel edge termination structures.

It should be noted that the enumerated SiC semiconductor devices are representative only, and are not intended to limit the scope of the invention to the disclosed devices. Furthermore, the number size, and spacing of the epitaxial guard rings may vary, depending on the application and the desired target blocking voltage and are not limited to the representative examples provided in this specification.

BRIEF DESCRIPTION OF THE DRAWINGS

The present invention may be better understood by reference to the accompanying drawings in which.

DETAILED DESCRIPTION OF THE INVENTION

When considering the fabrication of epitaxial semiconductor devices, which can be PiN diodes, Schottky diodes, bipolar junction transistors (BJTs), static induction transistors (SITs), and other well known semiconductor devices, with all other factors being equal, the use of epitaxially grown guard rings is more preferable than implanted guard rings, because their fabrication can be combined with etching steps for other parts of the device and because it allows costly implantation steps to be avoided. Moreover, the leakage current due to the surface and bulk damage produced by ion implantation, can be greatly reduced by using epitaxially grown edge termination structures.

In addition, SiC semiconductor devices comprising SiC layers of differing conductivity type, i.e., negative (n) and positive (p) types, are formed by introducing chemical impurities into SiC. Introducing electron donor atoms into pure SiC generates n-type SiC, and introducing electron acceptor atoms into pure SiC generates p-type SiC. Typically, the process of introducing donor or acceptor atoms into SiC, known as doping the SiC, is accomplished by ion implantation, or by the introduction of such impurities in situ during growth of the SiC layer. Ion implantation, however, can result in surface and bulk damage. Ion implantation also requires a special treatment after implantation (e.g., a post implant anneal) to activate the implanted impurity. Further, even after a high temperature post-implant anneal, a large percentage of certain implanted impurities (e.g., boron and aluminum which are typically used for p-type doping in SiC) can remain electrically inactive occupying interstitial sites. This phenomenon can result in a reduction in the electron lifetime of the implanted layer, e.g., when the free hole concentration is much smaller than the atomic concentration of the impurity.

Doping in situ during epitaxial growth can be used to avoid the aforementioned problems associated with ion implantation. In particular, the guard rings of the present invention are formed from an epitaxially grown layer, and thus avoid the problems associated with ion implantation.

According to the present invention, various semiconductor devices having epitaxially grown edge termination structures are provided, as are methods for preparing these devices.

Figure 1A:
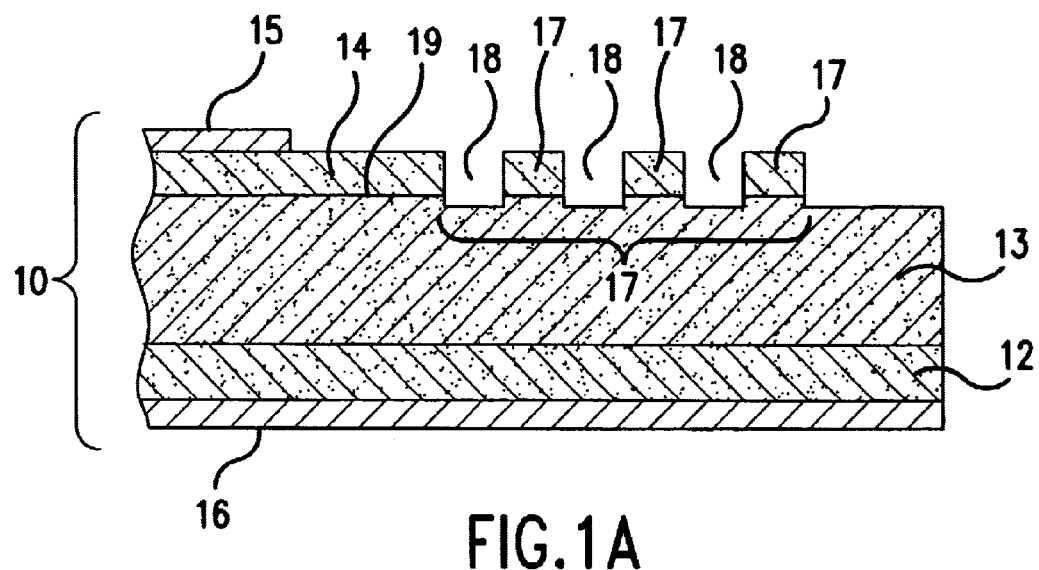
FIG. 1A is a portion of a schematic cross-section of a PiN diode with guard rings made from the same epitaxial layer as the anode region.

FIG. 1A shows a portion of a cross sectional view of a portion of a PiN diode with epitaxially grown guard rings according to a first embodiment of the invention. The diode 10 comprises a SiC substrate doped with donor atoms (n-type) 12 having a top and a bottom surface, a SiC layer, lightly doped with donor atoms (n-drift layer) 13 disposed on the top surface of the SiC substrate, an anode disposed on the n-drift layer comprising a SiC layer doped with acceptor atoms (p-type) 14, an ohmic contact at the anode 15, a second ohmic cathode contact 16, and p-type guard rings 17. The surface at which the n-drift and p layers meet is the main junction 19 of this device. The guard rings are spaced from the edge of the main junction between the anode and the n-drift region by trenches 18.

The structure shown in FIG. 1A can be made by providing an n-type SiC substrate 12, forming on a top surface of the n-type substrate 12, in succession, an n-type drift layer 13, and a p-type layer, and by the subsequent etching of the p-type layer to produce the anode 14 and patterned rings 17 shown. The substrate 12 may be a doped SiC single crystal, such as those which may be obtained commercially from Cree, Inc. of North Carolina.

The n-drift layer 13 and p-type layers are preferably formed by known techniques for epitaxial growth. The anode 14 and guard rings 17 may be formed from the epitaxially grown p-layer by masking, patterning and etching through this p-type layer using well known techniques. The anode ohmic contact 15 can then be disposed as shown.

According to a preferred embodiment of the invention, the n-type substrate layer is heavily doped with a donor material and the drift layer is lightly or moderately doped with a donor material. Suitable donor materials include arsenic, nitrogen and phosphorous. Nitrogen is a preferred donor material according to the invention. The above materials are merely exemplary, however, and any suitable donor material for silicon carbide can be used.

The layer from which the anode and the guard rings are formed is preferably heavily doped with an acceptor material. Suitable acceptor materials for doping silicon carbide include aluminum, boron and gallium. Aluminum is a preferred acceptor material. The above materials are merely exemplary, however, and any acceptor material which can be doped into silicon carbide can be used according to the invention. The thickness of this p-type layer can also be varied.

Unless otherwise indicated, heavily doped in the context of the invention corresponds to dopant concentrations of $10^{18}$ atoms $cm^3$ or greater, lightly doped corresponds to dopant concentrations of $5 \times 10^6$ atoms $cm^{-3}$ or less and moderately doped corresponds to dopant concentrations of less between $5 \times 10^{16}$ atoms $cm^{-3}$ and $10^{18}$ atoms $cm^{-3}$. The doping levels of the various layers of the PiN diode according to the invention can be varied to produce a device having desired characteristics for a particular application.

The PiN diodes according to the present invention can be made without expensive ion implantation and post-implant anneal steps. Moreover, the use of a heavily doped epitaxial layer to form the anode region allows fabricating at the same time the guard ring edge termination structure which can be used to increase the blocking capabilities of the device.

Although three guard rings are shown in FIG. 1A, any number of guard rings may be employed according to the invention to achieve desired blocking capabilities for the devices described herein. Further, the spacing and width of the guard rings can also be varied according to the invention to achieve the desired edge termination effects.

Figure 1B:
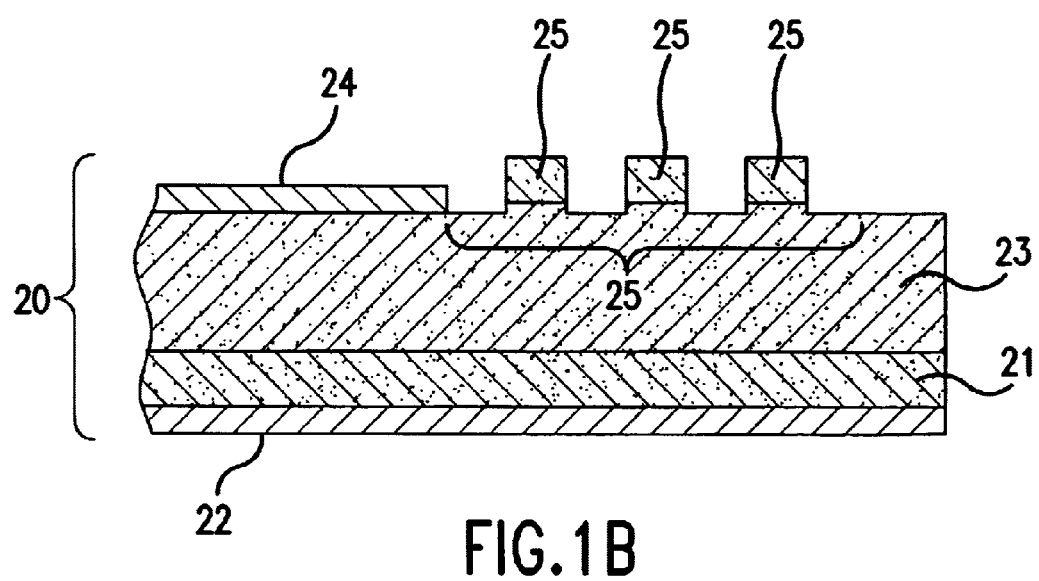
FIG. 1B is a portion of a schematic cross-section of a Schottky diode with epitaxial guard rings.

FIG. 1B shows a portion of a cross section of a typical Schottky barrier rectifier, sometimes referred to as a Schottky diode, with epitaxial guard rings, according to a second embodiment of the present invention. The Schottky diode shown 20 comprises an n-type SiC substrate 21 having a top and bottom surfaces, an ohmic contact 22 formed on the bottom surface of the substrate, a lightly doped n-drift SiC layer 23 formed on the top surface of the substrate, a Schottky contact 24 disposed on the top surface of the n-type drift layer 23 and p-type guard rings 25 surrounding the barrier contact.

As with the structure shown in FIG. 1A, the n-drift layer 23 of the device shown in FIG. 1B is preferably formed by known techniques for epitaxial growth. The guard rings 25 may similarly be formed from an epitaxially grown p-layer disposed atop the n-drift layer by masking, patterning and etching through the p-type layer using well known techniques. The Schottky contact 24 can then be disposed as shown.

Figure 1C:
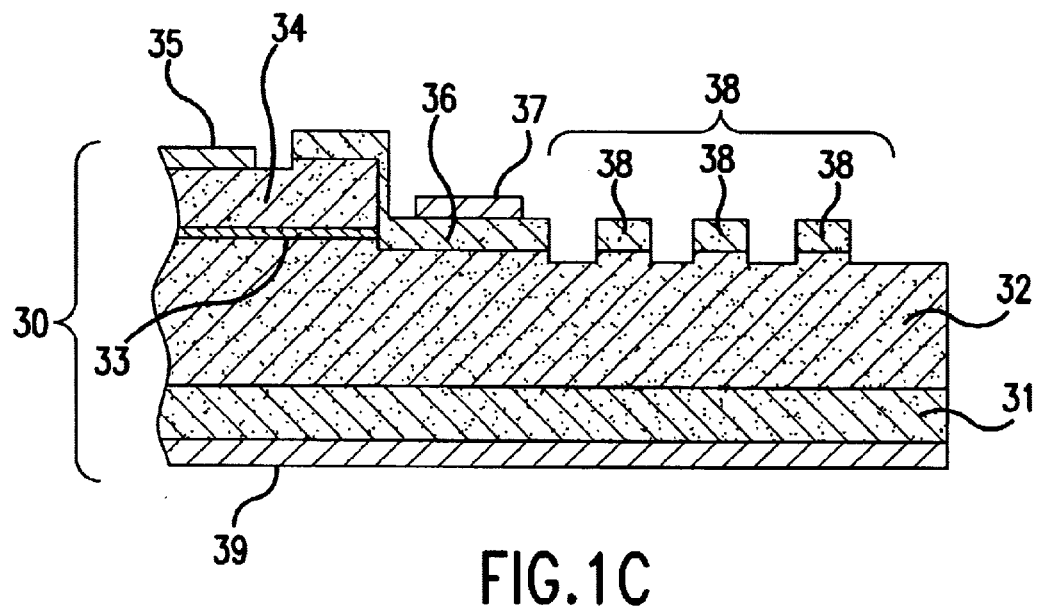
FIG. 1C is a portion of a schematic cross-section of an advanced fully epitaxial bipolar junction transistor (BJT) with guard rings made at the same etching step with the overgrown base region.

FIG. 1C shows a portion of the cross section of an advanced fully epitaxial bipolar junction transistor (BJT) 30 with epitaxial guard rings according to an embodiment of the present invention. The device 30 comprises an n-type SiC substrate layer 31 on top of which a lightly doped n-drift SiC 32 layer is disposed, a p-type SiC base layer 33 formed on the n-drift layer 32, an n-type SiC emitter layer 34 disposed on the p-type base layer 33, an emitter contact 35 formed on the surface of the emitter layer 34, a heavily doped overgrown p-type SiC layer 36 disposed over the surface of and contacting the emitter 34, the edge of the p-base layer 33, and the n-drift layer 32, a base contact 37 formed on the surface of the overgrown p-type layer, and heavily doped p-type SiC guard rings 38, as shown. This device and a method of making this device may be prepared as described in copending application Ser. No. 10/079,893, filed on Feb. 22, 2002, which is incorporated in its entirety herein by reference.

Although a drift layer 32 is shown in FIG. 1C, it is not necessary for a BJT according to the invention to include a drift layer. A drift layer is typically used to improve operating characteristics of the device in certain applications (e.g., in power applications). If a drift layer is used, the drift layer will have a doping level, or concentration of donor atoms, less than that of the substrate layer. The drift layer thickness can be varied to achieve desirable operating characteristics. Drift layer thickness can be chosen based on the operating voltage and frequency. For high voltage applications, the drift layer preferably may have a thickness of 4 to 10 $\mu$m. For high frequency applications (e.g., 2 GHz), the drift layer may preferably have a thickness of less than 4 $\mu$m.

In addition, a self-aligned process according to the present invention comprises using the ohmic contact material from which the base of a BJT is formed as an etch mask for fabrication of guard rings surrounding the bipolar junction transistor.

Figure 1D:
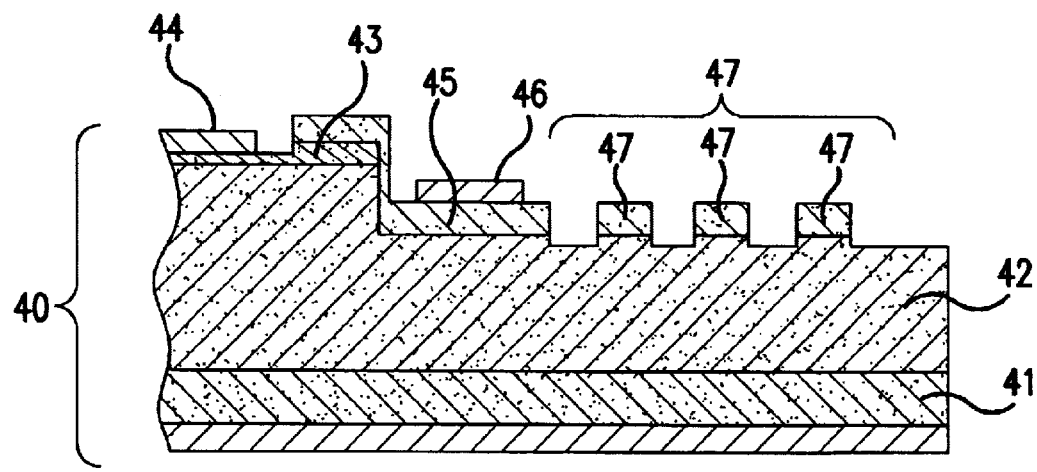
FIG. 1D is a portion of a schematic cross-section of an advanced fully epitaxial static induction transistor (SIT) with guard rings made at the same etching step with the overgrown base region.

FIG. 1D shows a portion of the cross section of an advanced fully epitaxial static induction transistor (SIT) 40 with epitaxial guard rings according to another embodiment of the present invention. The device 40 comprises an n-type SiC substrate layer 41 on top of which a lightly doped n-drift SiC 42 layer is disposed, an n-type SiC source layer 43 is formed on the n-drift layer 42, a source contact 44 formed on the surface of the source layer 43, a heavily doped overgrown p-type SiC gate 45 disposed over the surface of and contacting the source layer 43 and the n-drift layer 42, a gate contact 46 formed on the surface of the overgrown p-type gate 45, and heavily doped p-type SiC guard rings 47, as shown. Each doped SiC layer of this device may be epitaxially grown on the surface of the underlying layer, and the device may generally be prepared by the same methods disclosed herein and in copending application Ser. No. 10/079,893, filed on Feb. 22, 2002.

Figure 2A:
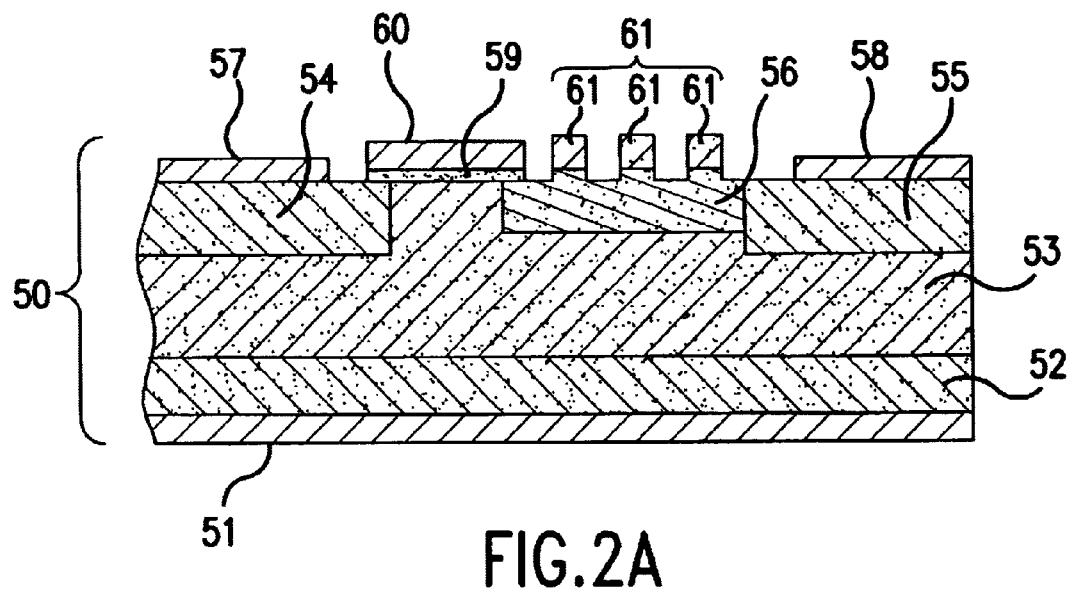
FIG. 2A is a portion of a schematic cross section of a lateral MOSFET with epitaxial guard rings (EGR)

FIG. 2A shows a portion of the cross section of a Lateral MOSFET (LMOSFET) SiC semiconductor device with epitaxial guard rings, according to an embodiment of the present invention. The LMOSFET shown 50 comprises an ohmic contact 51 formed on the bottom of a p-type or semi-insulating SiC substrate 52, over which a SiC p-type layer 53 is epitaxially grown, n-type source 54, n-type drain 55, and n-type drift 56 regions disposed on the epitaxially grown p-type layer 53, a source contact 57 disposed atop the source region 54, a drain contact 58 disposed atop the drain region 55, a gate oxide layer 59 disposed atop the epitaxially grown p-type SiC layer 53, gate contact 60, and epitaxial guard rings 61. LMOSFETs may generally be prepared by well known methods, see, e.g., Spitz, et al., "2.6 kV 4H-SiC Lateral DMOSFET's," IEEE Electron Device Letters, Vol. 19, No. 4, (1998), and, according to the present invention, the guard rings 61 are formed from an epitaxially grown p-type SiC layer.

Figure 2B:
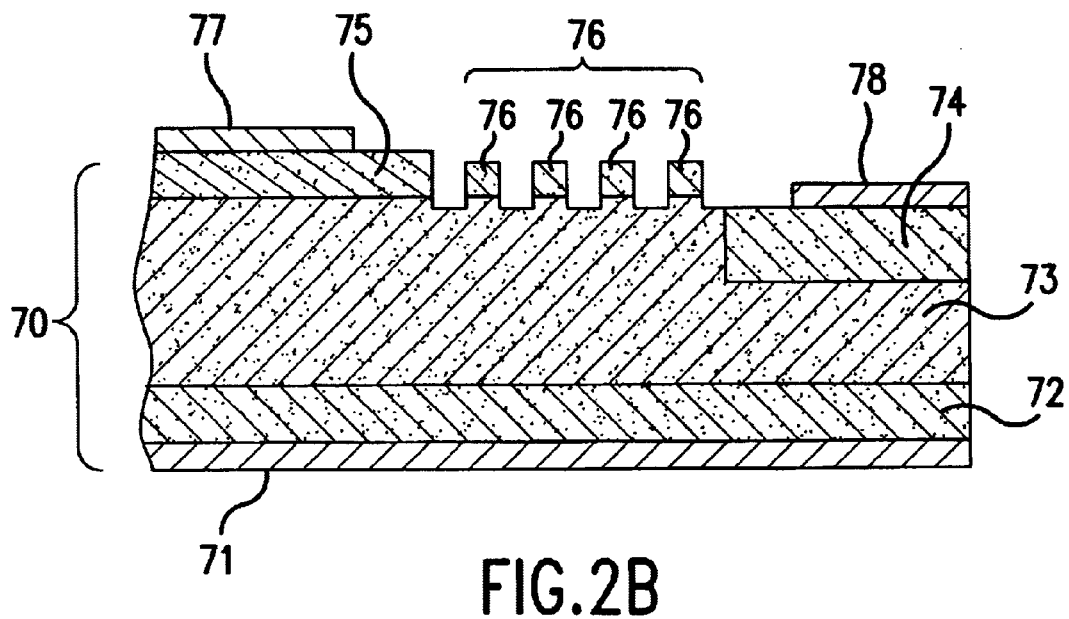
FIG. 2B is a portion of a schematic cross-section of a Lateral PiN diode with epitaxial guard rings (EGR)

FIG. 2B shows a portion of the cross section of a Lateral PiN diode with epitaxial guard rings, according to an embodiment of the present invention. The Lateral PiN diode shown 70 comprises an ohmic contact 71 formed on the bottom of a semi-insulating SiC substrate 72, over which a SiC n-type drift layer 73 is formed, an n-type cathode SiC region 74 disposed on the n-drift layer 73, a p-type SiC anode 75 disposed on the n-drift layer, p-type epitaxial guard rings 76, an anode contact 77 and a cathode contact 78. This device may be prepared by well known methods, and, according to the present invention, the guard rings 76 and the anode 75 may be formed from the same epitaxially grown p-type SiC layer.

According to the present invention, the number of guard rings employed may be varied with the thickness of the n-type layer and the desired target blocking voltage. The thicker the n-type layer and the higher the desired blocking voltage, the greater the number of rings that should be used. Typically 3–5 rings are employed in SiC power semiconductor devices; however, the present invention imposes no limit on the minimum or maximum number of guard rings which may be used. Instead, the only practical limitations on the number of epitaxial guard rings are the desired dimension of the semiconductor device itself, and the resolution of known lithography techniques which define the minimum size of the trenches between the rings.

Furthermore, it is preferred for the guard rings to be spaced closely together to ensure a finer gradation in the depletion layer at the edge of a device and more uniform electric field distribution. In particular, the space between the inner wall of the guard ring closest to the main junction, or barrier contact of the semiconductor device and the main junction or barrier contact itself should be less than the width of the depletion region, and, in one preferred embodiment, may be 1–2 $\mu$m. That spacing, and the spacing between adjacent guard rings may optionally be as small as is possible using known lithography and etching techniques. Furthermore, although all of the figures show guard rings having straight walls, the etching techniques traditionally used to prepare SiC may result in either straight or curved guard ring walls, and both are within the scope of the present invention.

Figure 3A:
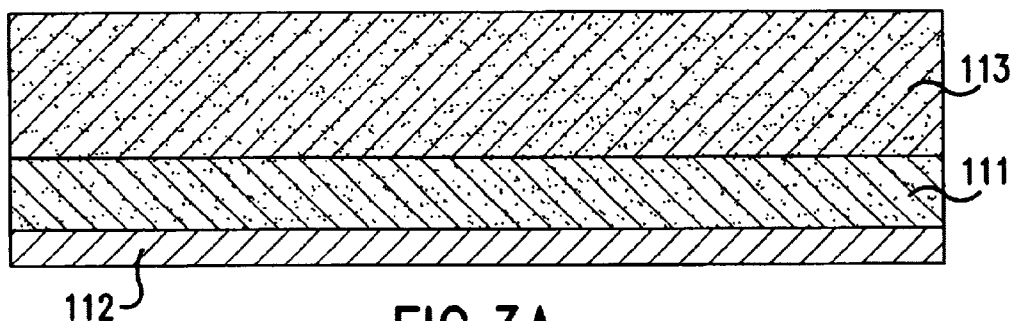
FIGS. 3A–D show cross-sectional views of the respective products of steps in a method of forming a simple PiN diode according to the invention.
Figure 3B:
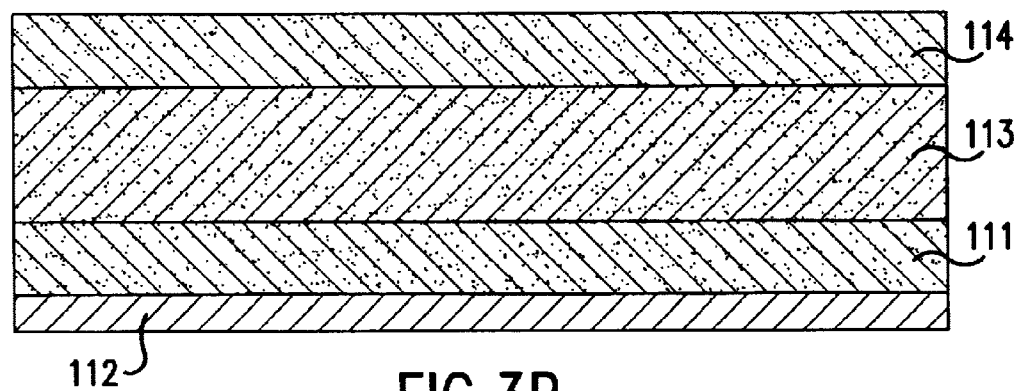

FIG. 3A shows a cross-sectional view of the product of the first step in a method of forming a simple PiN diode according to the invention. In FIG. 3A, a heavily doped n-type SiC substrate 111 is shown, having an ohmic contact 112 formed on its bottom surface, and an n-drift SiC layer 113 epitaxially grown on its top surface. FIG. 3B, shows the product of the second step in the method where a heavily doped SiC p-type layer 114 is formed on surface of the n-drift layer 113. The SiC layers of the present invention may be formed by any epitaxial growth method known in the art, including chemical vapor deposition (CVD), molecular beam epitaxy and sublimation epitaxy. According to preferred embodiment of the invention, the doped SiC layers according to the invention are formed by doping in situ during epitaxial growth wherein dopant atoms are incorporated into the silicon carbide during growth.

Figure 3C:
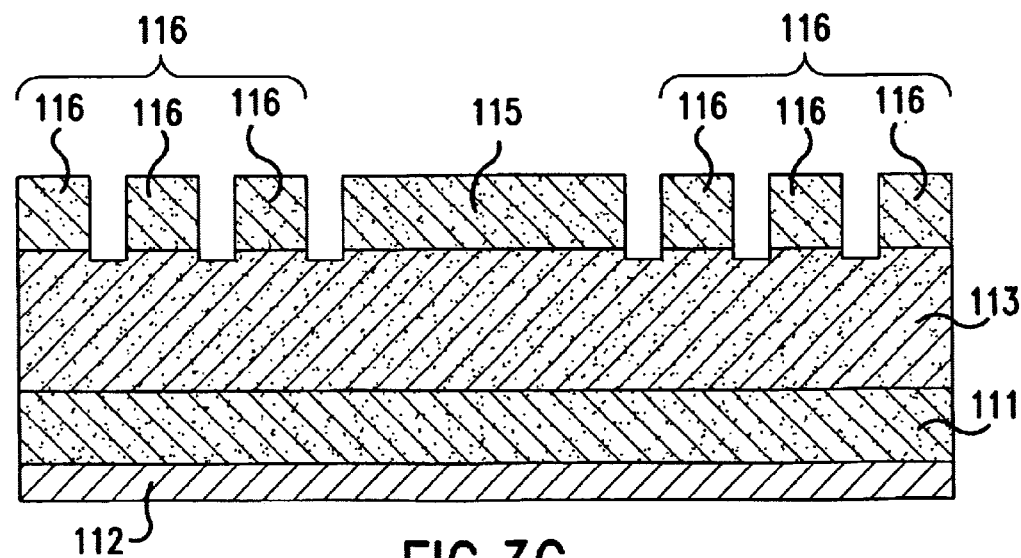
Figure 3D:
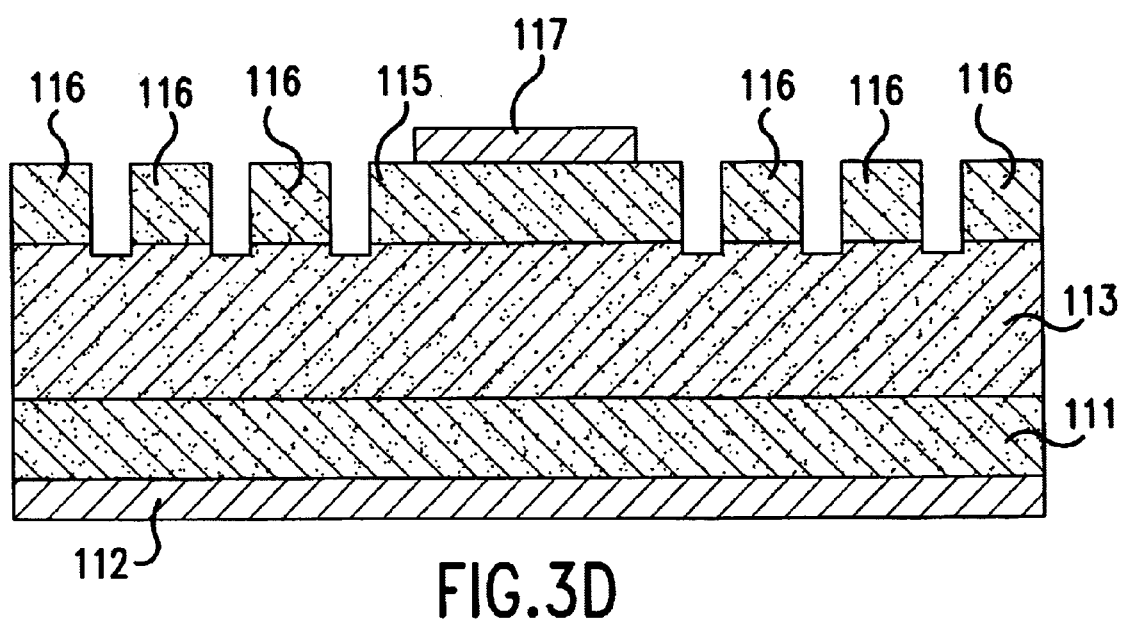

FIG. 3C shows the results of the selective removal of portions of the heavily doped p-type substrate, which may be accomplished using conventional photolithography and etching techniques, to form the anode 115, as well as three guard rings 116. FIG. 3D shows the results of the final step in the method of preparing a simple PiN diode, forming the anode ohmic contact 117 disposed on the top surface of the anode 115.

Figure 4:
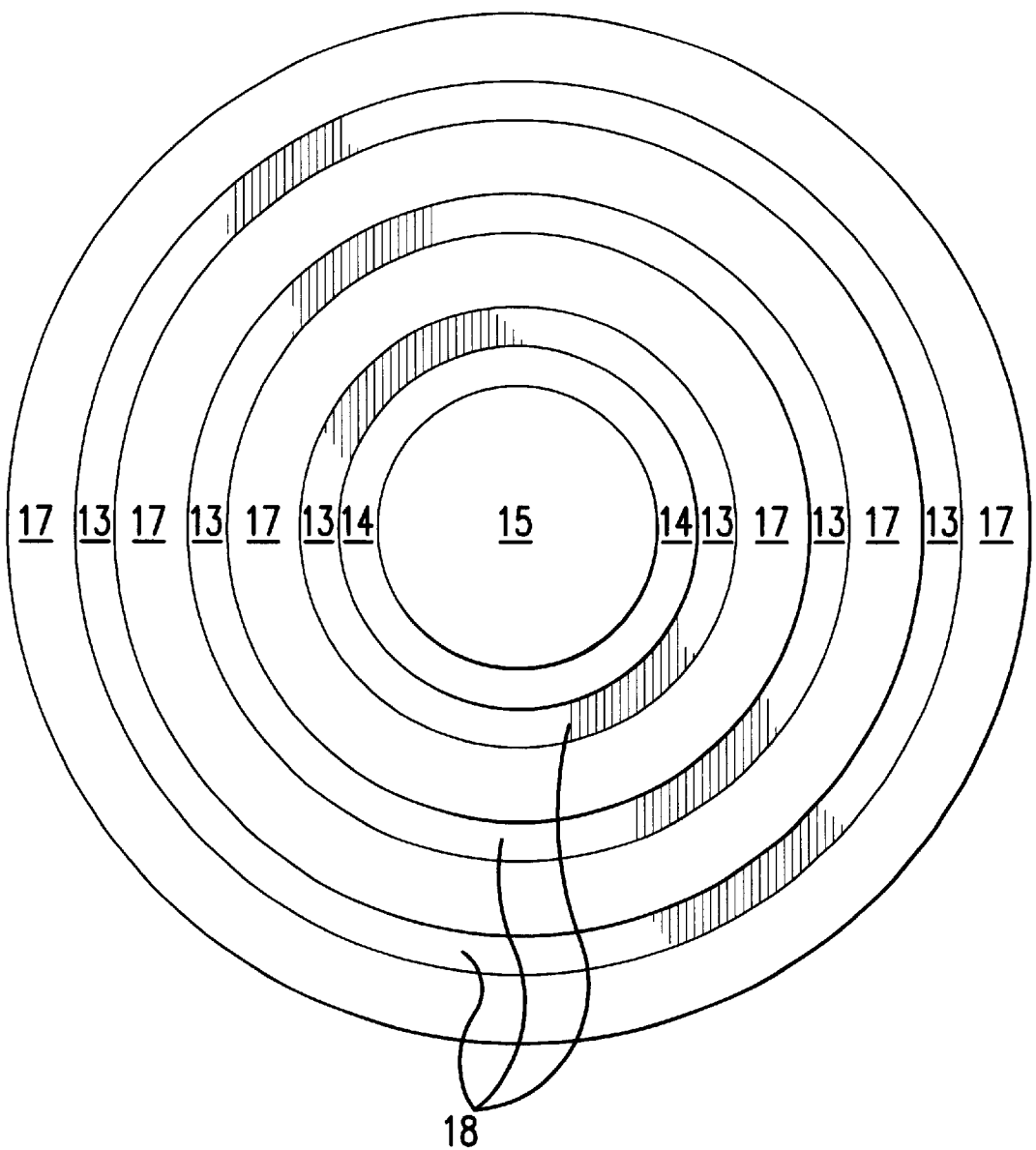
FIG. 4 shows an aerial view of the PiN diode shown in FIG. 1A.

FIG. 4 shows an example aerial view of the PiN diode shown in FIG. 1A. The visible portion of the PiN diode shown comprises the lightly doped n-drift SiC layer 13, the SiC anode disposed on the n-drift layer 14, the ohmic contact disposed on the anode 15, the p-type guard rings 17, and the trenches 18.

From the foregoing, it will be appreciated that, although specific embodiments of the invention have been described herein for purposes of illustration, various modifications may be made without deviating from the spirit and scope of the invention.

What is claimed is:

1. A silicon carbide (SiC) semiconductor device comprising:
   a first layer of SiC doped with donor or acceptor atoms, and a second layer of material of a differing conductivity type disposed on a surface of the first layer, said first and second layers forming a junction at the interface of these layers; said device further comprising
   a plurality of non-intersecting rings circumscribing the junction,
   wherein the rings are formed of SiC doped with acceptor atoms, and
   wherein these rings are disposed on a surface of a layer of the device formed of SiC doped with donor atoms.

2. The device of claim 1, wherein the SiC doped with acceptor atoms from which the SiC rings are formed is a layer epitaxially grown.

3. The device of claim 1, wherein the silicon carbide semiconductor device is selected from the group consisting of:
   a PiN diode, a Schottky diode, a bipolar junction transistor and a static induction transistor.

4. The device of claim 1, wherein the silicon carbide semiconductor device is selected from the group consisting of:
   a Lateral MOSFET and a Lateral PiN diode.

5. The device of claim 1, wherein the junction is an interface between a metal layer and a SiC semiconductor layer.

6. The silicon carbide device of claim 1, further comprising an innermost ring having an inner wall having a base whose distance from the circumference of the junction is uniform.

7. The device of claim 6, wherein the base of the inner wall is spaced from the circumference of the junction by less than the thickness of a depletion region of the junction.

8. The device of claim 1, wherein there is one ring.

9. The device of claim 1, wherein there are at least two rings.

10. The device of claim 1 wherein the geometry of the circumference of each of the rings is not a circle.

11. A semiconductor device made by a method comprising:
   forming a junction at an interface of a first layer of SiC doped with donor or acceptor atoms, and a second layer of material of a differing conductivity type disposed on a first surface of the first layer; and
   epitaxially growing a SiC layer, doped in situ during growth with electron acceptor atoms, on a surface of a SiC layer doped with electron donor atoms to form an epitaxially grown p-type SiC layer; and
   etching a plurality of non-intersecting trenches through the epitaxially grown p-type SiC layer to form a plurality of raised rings,
   wherein the raised rings circumscribe said junction of the device.

12. The device of claim 1, wherein the donor atoms are selected from the group consisting of: Arsenic, Nitrogen and Phosphorus.

13. The device of claim 1, wherein the concentration of donor atoms in the SiC layer doped with donor atoms is less than $5 \times 10^{16}$ cm$^{-3}$.

14. The device of claim 1, wherein the acceptor atoms are selected from the group consisting of: Aluminum, Boron and Gallium.

15. The device of claim 1, wherein the concentration of acceptor atoms in the epitaxially grown p-type SiC layer is $10^{18}$ cm$^{-3}$ or greater.

16. The device of claim 1, wherein the first layer is doped with donor atoms, the second layer comprises SiC doped with acceptor atoms, and the rings are disposed on the same side of a surface of the first layer on which the second layer is disposed.

17. The device of claim 16, wherein the concentration of donor atoms in the first layer is less than $5 \times 10^{16}$ cm$^{-3}$.

18. The device of claim 16, wherein a surface of the first layer that is opposite to the surface that forms a junction with the second layer is disposed on a surface of a third SiC layer.

19. The device of claim 18, wherein the third layer is doped with donor atoms.

20. The device of claim 19, wherein the concentration of donor atoms in the third layer is greater than $5 \times 10^{16}$ cm$^{-3}$.

21. The device of claim 19, wherein the concentration of donor atoms in the third layer is greater than $10^{18}$ cm$^{-3}$.

22. The device of claim 1, wherein the first layer is doped with acceptor atoms, the second layer comprises SiC doped with donor atoms, and the rings are disposed on a surface of the second layer that is opposite the surface of the second layer that forms the junction with the first layer.

23. The device of claim 22, wherein the concentration of acceptor atoms in the first layer is less than $5 \times 10^{16}$ cm$^{-3}$.

24. The device of claim 22, wherein the concentration of acceptor atoms in the first layer is between $5 \times 10^{16}$ cm$^{-3}$ and $10^{18}$ cm$^{-3}$, inclusive.

25. The device of claim 22, wherein a surface of the first layer that is opposite to the surface that forms a junction with the second layer is disposed on a surface of a third SiC layer doped with acceptor atoms.

26. The device of claim 22, wherein a surface of the first layer that is opposite to the surface that forms a junction with the second layer is disposed on a surface of a third layer which comprises a semi-insulating SiC substrate.

* * * * *